United States Patent
Ishikawa

(10) Patent No.: US 8,115,325 B2
(45) Date of Patent: Feb. 14, 2012

(54) SEMICONDUCTOR INTEGRATED CIRCUIT INCLUDING PLURALITY OF BONDING PADS

(75) Inventor: Kenichi Ishikawa, Kanagawa (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 328 days.

(21) Appl. No.: 12/385,501

(22) Filed: Apr. 9, 2009

(65) Prior Publication Data

US 2009/0315191 A1    Dec. 24, 2009

(30) Foreign Application Priority Data

Jun. 23, 2008  (JP) .................. 2008/163111

(51) Int. Cl.
| | |
|---|---|
| H01L 23/522 | (2006.01) |
| H01L 21/822 | (2006.01) |
| H01L 27/04 | (2006.01) |
| H01L 21/82 | (2006.01) |
| H01L 23/52 | (2006.01) |

(52) U.S. Cl. ......... 257/786; 257/E23.142; 257/E23.114; 257/E27.07; 257/E27.067; 257/773; 257/774; 257/203; 257/208; 257/211; 257/698; 257/691; 257/659

(58) Field of Classification Search .................. 257/786, 257/773, 774, E23.142, 203, 208, 211, 698, 257/691, 659, E23.114, E27.07, E27.067
See application file for complete search history.

(56) References Cited

U.S. PATENT DOCUMENTS

| 6,960,793 B2* | 11/2005 | Ushiyama ............... 257/207 |
| 7,554,133 B1* | 6/2009 | Ali et al. ................. 257/203 |
| 7,750,373 B2* | 7/2010 | Taniguchi et al. ........ 257/203 |
| 2007/0023927 A1 | 2/2007 | Nagai et al. |

FOREIGN PATENT DOCUMENTS

| JP | 2007-59867 | 3/2007 |
| JP | 2007-305822 | 11/2007 |

* cited by examiner

Primary Examiner — A O Williams
(74) Attorney, Agent, or Firm — McGinn IP Law Group, PLLC

(57) ABSTRACT

A semiconductor integrated circuit includes a plurality of bonding pads formed along an edge of a semiconductor substrate; a plurality of I/O cells arranged along the edge under the plurality of bonding pads; an upper layer wire mesh including a plurality of upper layer wirings; and a core region formed on the semiconductor substrate. In the semiconductor integrated circuit, the core region has an area larger than an area occupied by the upper layer wire mesh in a plane parallel to a surface of the semiconductor substrate.

10 Claims, 5 Drawing Sheets

SEMICONDUCTOR INTEGRATED CIRCUIT INCLUDING PLURALITY OF BONDING PADS

BACKGROUND OF THE INVENTION

1. Field of the Invention

The present invention relates to a semiconductor integrated circuit, and more particularly, to a semiconductor integrated circuit connected to a lead electrode through a bonding wire.

2. Description of the Related Art

A currently available IC chip includes a core region having a logic circuit and a memory circuit, and an I/O region provided in a periphery of the core region. The I/O region is provided with a bonding pad for connecting the IC chip and a lead electrode provided on a lead frame side. There is known a technology in which, along with the progress of a miniaturization technology for semiconductor integrated circuits, the I/O region is made smaller (see JP2007-305822A and JP2007-059867A, for example).

JP 2007-305822 A describes a technology relating to a semiconductor integrated circuit, in which shortage of connection pads for supplying power to a core region is prevented so that the same connection method can be applied to all the connection pads without decreasing a cell width of an I/O cell. In the technology described in JP 2007-305822 A, two rows of connection pads are arranged with shifts on I/O cells of an I/O region, and connection pads are also arranged on core power wiring arranged along a side of the core region. Each pad pitch among those connection pads is set, with respect to a cell pitch of the I/O cells, as pad pitch=2×cell pitch, and a pad pitch of the whole connection pads is set as pad pitch/3(=2×cell pitch/3), whereby three connection pads are arranged per two I/O cells.

Further, JP 2007-059867 A describes a technology for reducing an area of a semiconductor integrated circuit by reducing in size of an I/O region. In the technology described in JP 2007-059867 A, an interlayer film is provided on an entire surface of the semiconductor integrated circuit while keeping a state in which a part of a pad metal formed on the I/O region is exposed. Further, an electrode pad is provided on the interlayer film of an active region (core region). The pad metal and the electrode pad are electrically connected to each other through a connection via. Then, a protective film is formed on the entire surface of the semiconductor integrated circuit with the electrode pad being exposed. JP2007-059867A discloses a technology of, with such a structure, making the I/O region smaller than the electrode pad.

In response to the miniaturization of devices along with the progress of the semiconductor technology, the I/O cell of the I/O region has also been miniaturized. In contrast to the miniaturization of the I/O cell, a bonding pad is difficult to be made small, and hence a region occupied by the bonding pad may become a cause that hinders reduction in size of the entire IC chip.

SUMMARY

Hereinafter, means for solving the problem is described with the use of the numbers used in the section "Detailed Description of the Preferred Embodiment". Those numbers are given so as to clarify a correspondence relationship between the descriptions of the section "What is Claimed is" and the section "Detailed Description of the Preferred Embodiment". Note that those numbers should not be used for interpretation of the technical scope of the invention described in the section "What is Claimed is".

In order to solve the above-mentioned problem, there is provided a semiconductor integrated circuit (1) including: a plurality of bonding pads (5, 6, 7) formed along an edge of a semiconductor substrate (2); a plurality of I/O cells (3) arranged along the edge under the plurality of bonding pads (5, 6, 7); an upper layer wire mesh (24) including a plurality of upper layer wirings (13); and a core region (4) formed on the semiconductor substrate (2). In the semiconductor integrated circuit (1), the core region (4) has an area larger than an area occupied by the upper layer wire mesh (24) in a plane parallel to a surface of the semiconductor substrate (2).

According to the present invention, the semiconductor integrated circuit capable of effectively using a chip area which is relatively increased in response to the miniaturization of the I/O cell can be structured without depending on the reduction in size of the bonding pad. In other words, an appropriate area for arranging an internal cell can be secured without depending on an area which is occupied by the bonding pad arranged on an IC chip.

DETAILED DESCRIPTION OF THE PREFERRED EMBODIMENT

Figure 1:
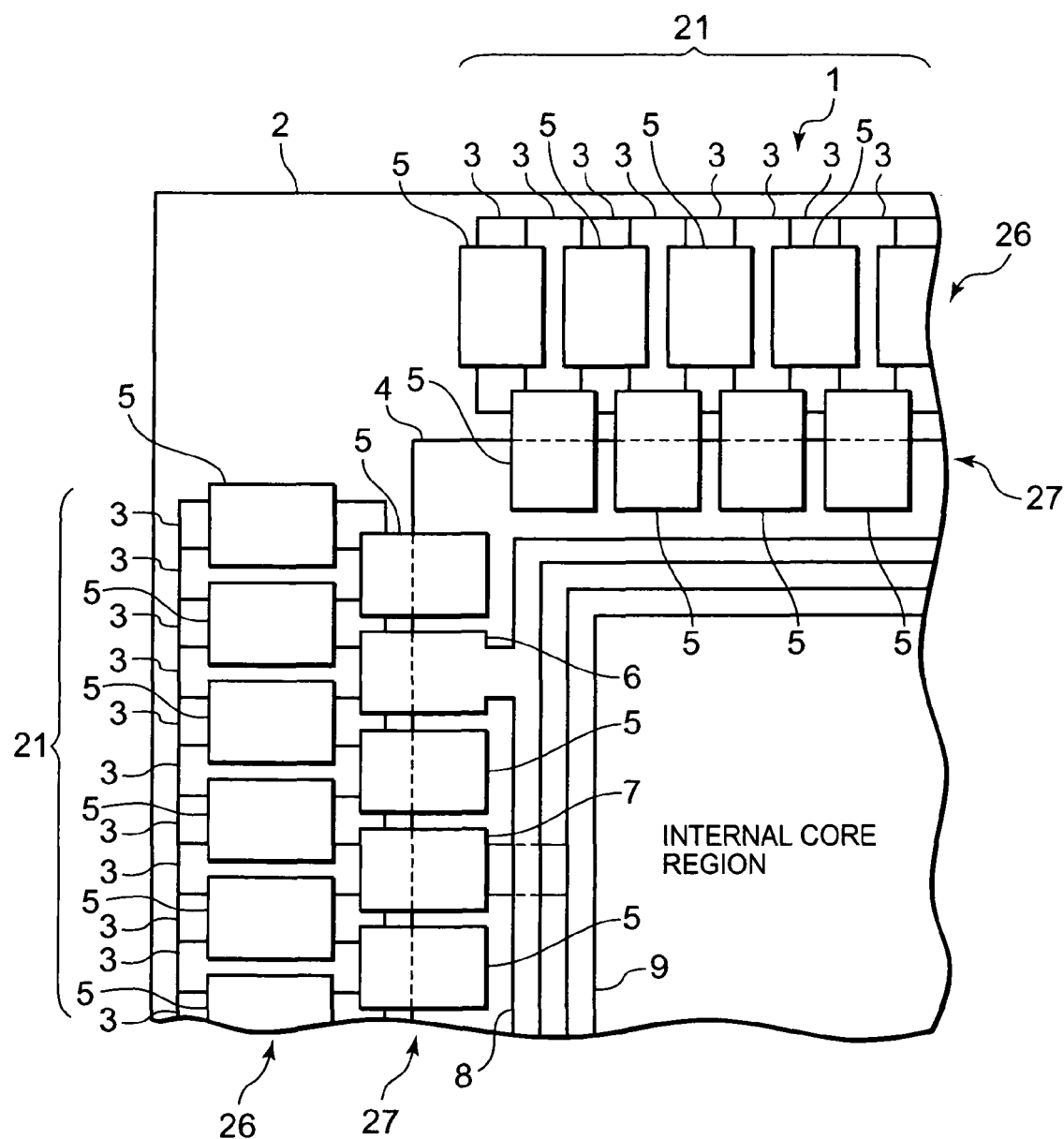
FIG. 1 is a plan view illustrating a structure of a semiconductor integrated circuit according to an embodiment of the present invention.

Hereinafter, a description is made on an embodiment of the present invention with reference to the drawings. FIG. 1 is a plan view illustrating a structure of a semiconductor integrated circuit (IC chip) 1 according this embodiment. The semiconductor integrated circuit 1 according to this embodiment is formed on a chip substrate (hereinafter, referred to as semiconductor substrate 2) which is obtained by dicing a wafer substrate. The semiconductor substrate 2 includes a plurality of I/O cells 3 arranged in an I/O region 21 in a chip peripheral portion, and an internal core region 4 including a plurality of logic cells (not shown) and a plurality of memory cells (not shown).

On the I/O cells 3 or the internal core region 4, a plurality of bonding pads are arranged. The plurality of bonding pads 5 are arranged along a first pad row 26 and a second pad row 27. On the first pad row 26, a plurality of bonding pads for signal 5 are formed. On the second pad row 27, the plurality of bonding pads for signal 5, at least one first bonding pad for power supply 6, and at least one second bonding pad for power supply 7 are formed.

A first power supply ring 8 and a second power supply ring 9 are formed on the internal core region 4. The first power supply ring 8 is connected to the first bonding pad for power supply 6. The second power supply ring 9 is connected to the second bonding pad for power supply 7. Circuit devices such as the logic cells and the memory cells arranged in the internal core region 4 operate in response to electric power supplied through the first power supply ring 8 and the second power supply ring 9.

Figure 2:
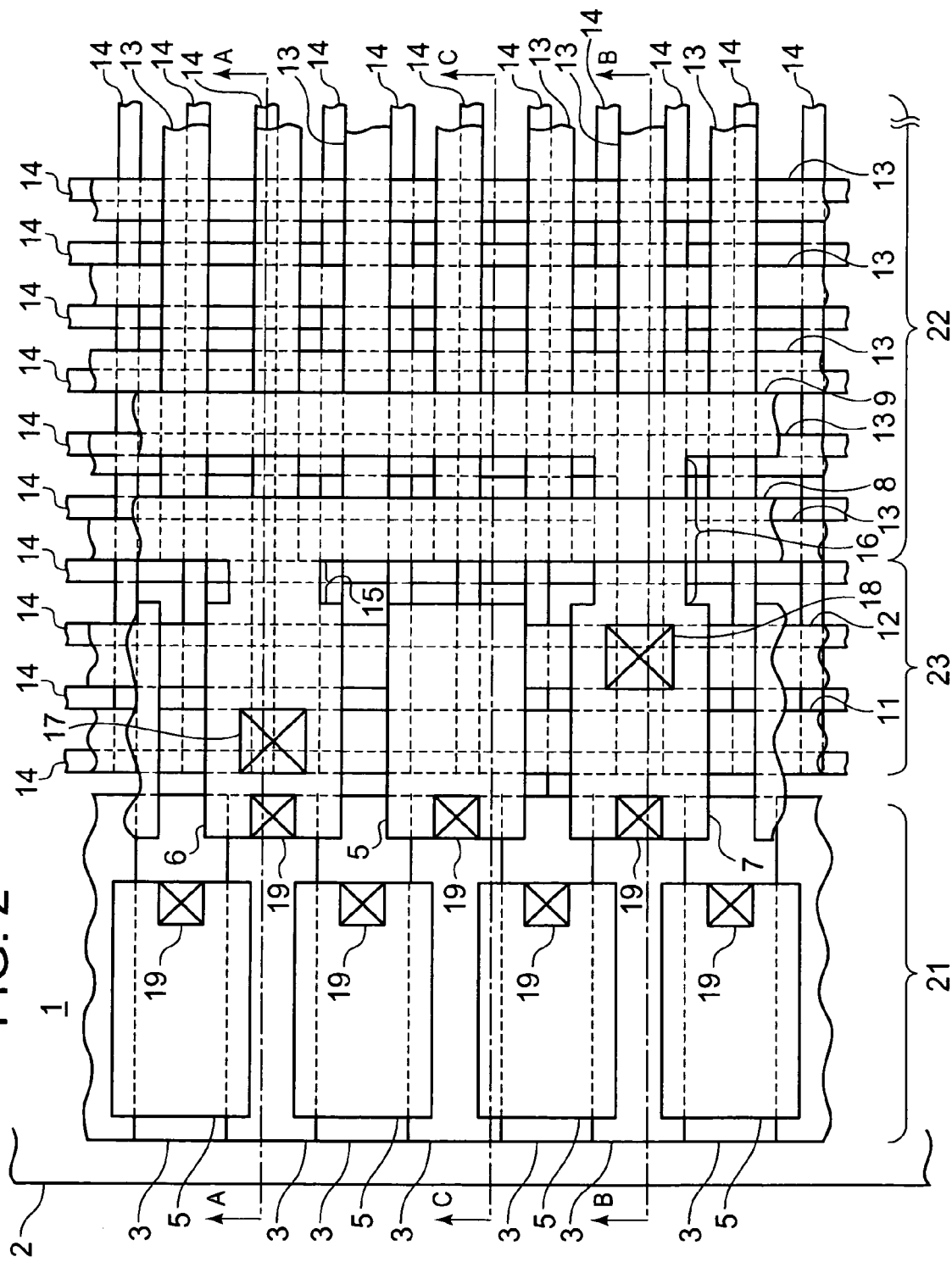
FIG. 2 is a plan view illustrating the structure of the semiconductor integrated circuit according to the embodiment of the present invention.

FIG. 2 is a plan view illustrating in detail the structure of the semiconductor integrated circuit 1. As illustrated in FIG. 2, the bonding pads for signal 5, the first bonding pad for power supply 6, and the second bonding pad for power supply 7 are connected to the I/O cells 3 through connection contacts for signal 19. The first bonding pad for power supply 6 is connected to the first power supply ring 8 through a first power supply ring connection wiring 15. Further, the first bonding pad for power supply 6 is connected to a first expansion power supply ring 11 through a first expansion ring connection contact 17. The second bonding pad for power supply 7 is connected to the second power supply ring 9 through a second power supply ring connection wiring 16. Further, the second bonding pad for 5 power supply 7 is connected to a second expansion power supply ring 12 through a second expansion ring connection contact 18.

The internal core region 4 includes a primary core region 22 and an expansion core region 23. A plurality of upper layer wirings 13 extending in a first direction are arranged on the primary core region 22. Moreover, on the primary core region 22, a plurality of upper layer wirings 13 extending in a second direction orthogonal to the first direction are arranged. In the primary core region 22, a plurality of lower layer wirings 14 are arranged below the upper layer wirings 13.

In the semiconductor integrated circuit 1 according to this embodiment, the expansion core region 23 includes the bonding pads for signal 5, the first bonding pad for power supply 6, and the second bonding pad for power supply 7 arranged therein, and the first expansion power supply ring 11 and the second expansion power supply ring 12 are arranged below the bonding pads for signal 5, the first bonding pad for power supply 6, and the second bonding pad for power supply 7. Further, in the expansion core region 23, a plurality of lower layer wirings 14 are arranged below the first expansion power supply ring 11 or the second expansion power supply ring 12.

Figure 3:
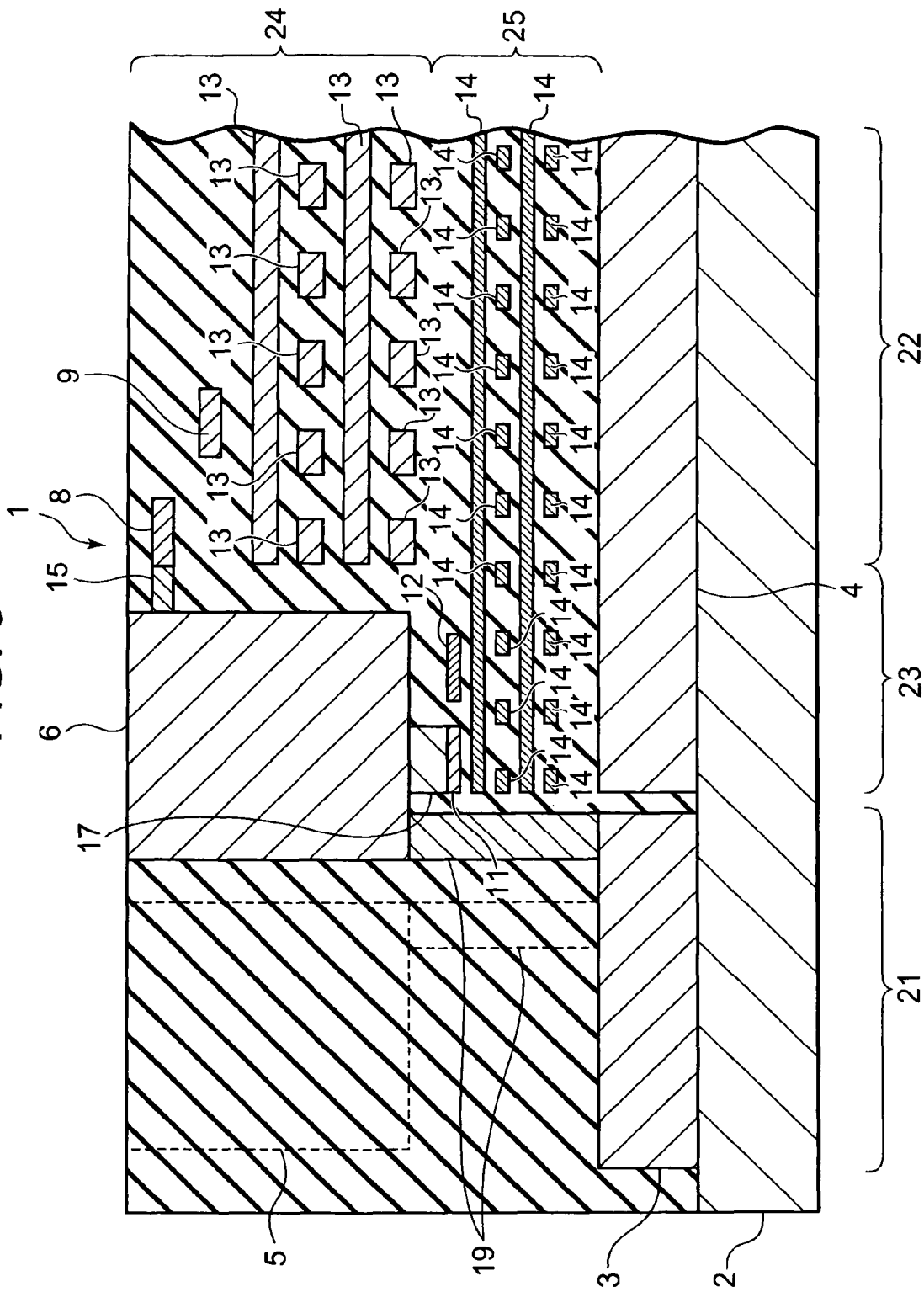
FIG. 3 is a sectional view illustrating the structure of the semiconductor integrated circuit according to the embodiment of the present invention.

FIG. 3 is a sectional view illustrating a cross section of the semiconductor integrated circuit 1 of this embodiment. FIG. 3 illustrates a structure of the cross section of the semiconductor integrated circuit 1 cut at a position denoted by the line segment A-A of FIG. 2 described above. As illustrated in FIG. 3, the semiconductor integrated circuit 1 includes the I/O cell 3 and the internal core region 4 which are formed on 5 the semiconductor substrate 2. Predetermined circuit devices (not shown) are formed on the I/O cell 3 and the internal core region 4. In this embodiment, a description on the detailed structure of the circuit devices and illustration thereof in the drawings are omitted for the purpose of facilitating understanding of the present invention.

Referring to FIG. 3, the internal core region 4 is formed so as to correspond to the primary core region 22 and the expansion core region 23. In the expansion core region 23, the lower layer wirings 14 corresponding to a plurality of wiring layers are arranged above the internal core region 4. Further, the semiconductor integrated circuit 1 of this embodiment includes an upper layer wire mesh 24 and a lower layer wire mesh 25. The plurality of upper layer wirings 13 are arranged in the upper layer wire mesh 24. The plurality of upper layer wirings 13 are arranged in the respective wiring layers. Further, the upper layer wire mesh 24 includes the first bonding pad for power supply 6, the first power supply ring 8, and the second power supply ring 9 arranged therein.

The plurality of lower layer wirings 14 are arranged in the lower layer wire mesh 25. The plurality of lower layer wirings 14 are arranged in the respective wiring layers. Further, the lower layer wire mesh 25 includes the first expansion power supply ring 11 and the second expansion power supply ring 12 arranged therein. At the cross section of the line segment A-A, the first bonding pad for power supply 6 is connected to the first expansion power supply ring 11 through the first expansion ring connection contact 17. Further, the first bonding pad for 5 power supply 6 is connected to the first power supply ring 8 through the first power supply ring connection wiring 15.

Figure 4:
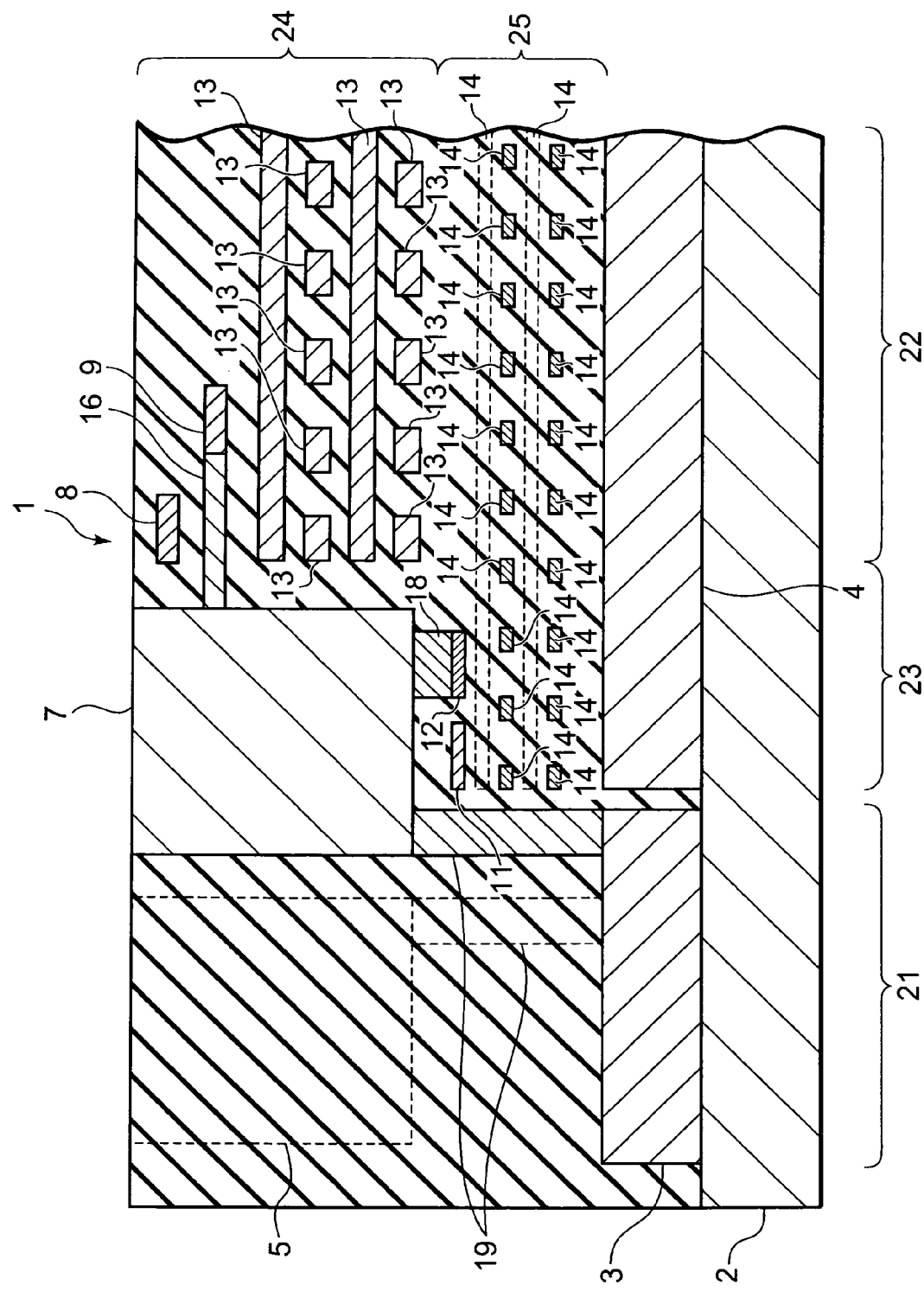
FIG. 4 is a sectional view illustrating the structure of the semiconductor integrated circuit according to the embodiment of the present invention.

FIG. 4 is a sectional view illustrating a cross section of the semiconductor integrated circuit 1 of this embodiment. FIG. 4 illustrates a structure of the cross section of the semiconductor integrated circuit 1 cut at a position denoted by the line segment B-B of FIG. 2 described above. Referring to FIG. 4, at the cross section of the line segment B-B, the second bonding pad for power supply 7 is connected to the second expansion power supply ring 12 through the second expansion ring connection contact 18. Further, the second bonding pad for power supply 7 is connected to the second power supply ring 9 through the second power supply ring connection wiring 16.

Figure 5:
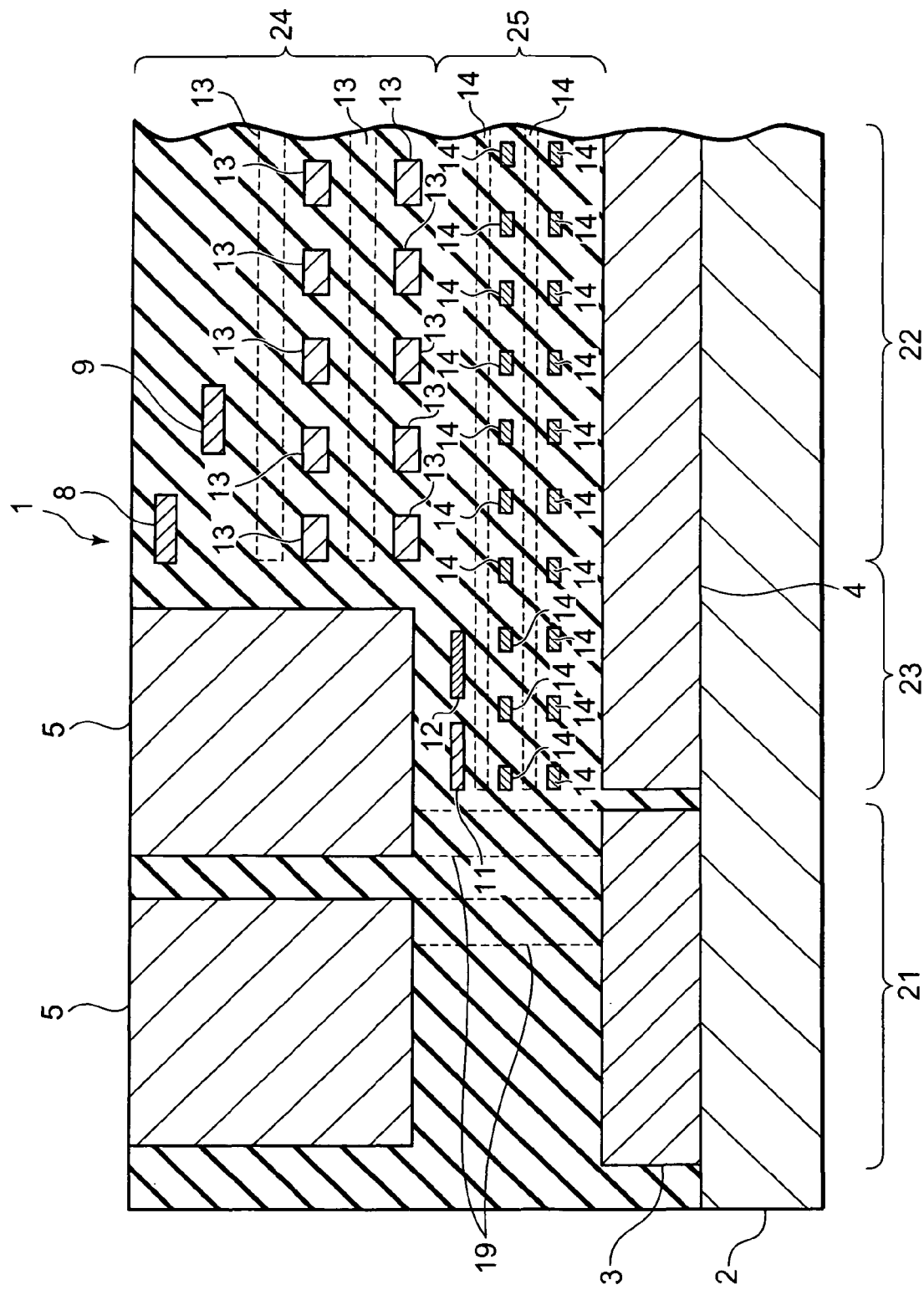
FIG. 5 is a sectional view illustrating the structure of the semiconductor integrated circuit according to the embodiment of the present invention.

FIG. 5 is a sectional view illustrating a cross section of the semiconductor integrated circuit 1 of this embodiment. FIG. 5 illustrates a structure of the cross section of the semiconductor integrated circuit 1 cut at a position denoted by the line segment C-C of FIG. 2 described above. Referring to FIG. 5, at the cross section of the line segment C-C, the bonding pads for signal 5 are formed in the semiconductor integrated circuit 1. The bonding pads for signal 5 are connected to the I/O cells 3 through the connection contacts for signal 19.

As described above, the primary core region 22, the lower layer wirings 14, and the plurality of bonding pads (bonding pads for signal 5, first bonding pad for power supply 6, and second bonding pad for power supply 7) are formed in the semiconductor integrated circuit 1 of this embodiment. With 5 this structure, the internal core region 4 can be formed substantially below the bonding pads for signal 5, the first bonding pad for power supply 6, and the second bonding pad for power supply 7, whereby the chip area can be utilized more efficiently. Further, in the semiconductor integrated circuit 1 of this embodiment, the first expansion power supply ring 11 is connected to the first bonding pad for power supply 6 through the first expansion ring connection contact 17, and the second expansion power supply ring 12 is connected to the second bonding pad for power supply 7 through the second expansion ring connection contact 18.

As described above, the first bonding pad for power supply 6 or the second bonding pad for power supply 7 is directly connected to the first expansion power supply ring 11 or the second expansion power supply ring 12. Accordingly, the first expansion power supply ring 11 or the second expansion power supply ring 12 can supply a power which is supplied from the first bonding pad for power supply 6 or the second bonding pad for power supply 7, directly to the lower layer wirings 14 provided therebelow. With this structure, power supply performance can be increased with respect to the circuit devices provided in the primary core region 22.

What is claimed is:

1. A semiconductor integrated circuit comprising:
    a plurality of bonding pads provided along an edge of a semiconductor substrate;
    a plurality of I/O cells arranged along the edge under the plurality of bonding pads;
    an upper layer wire mesh comprising a plurality of upper layer wirings;
    a core region formed on the semiconductor substrate; and a lower layer wire mesh formed between the semiconductor substrate and the upper layer wire mesh,
wherein the core region has an area larger than an area occupied by the upper layer wire mesh in a plane parallel to a surface of the semiconductor substrate;
wherein each of the plurality of bonding pads has a thickness equal to a thickness of the upper layer wire mesh including wiring layers;
wherein at least one wiring layer included in the lower layer wire mesh is formed so as to correspond to the core region.

2. The semiconductor integrated circuit according to claim 1, wherein:
the upper layer wire mesh comprises an upper layer annular power supply wiring; and
the lower layer wire mesh comprises a lower layer annular power supply wiring formed under the plurality of bonding pads.

3. The semiconductor integrated circuit according to claim 2, wherein:
the plurality of bonding pads comprise:
a power supply pad; and
a signal supply pad for supplying a signal to at least one of the plurality of I/O cells; and
the power supply pad is connected to the lower layer annular power supply wiring through a via contact, and to the upper layer annular power supply wiring through a wiring pattern in the upper layer wire mesh.

4. The semiconductor integrated circuit according to claim 3, wherein the plurality of bonding pads comprise:
a first pad group arranged along the edge of the semiconductor substrate on which the plurality of I/O cells are formed, the first pad group comprising the power supply pad and the signal supply pad; and
a second pad group arranged in a row different from a row in which the first pad group is arranged, the second pad group being formed between the first pad group and the edge.

5. The semiconductor integrated circuit according to claim 4, wherein the first pad group is arranged so as to cover at least a part of an I/O region and at least a part of the lower layer wire mesh.

6. A semiconductor integrated circuit, comprising:
an I/O region formed on a semiconductor substrate and comprising a plurality of I/O cells arranged thereon;
a core region formed on the semiconductor substrate and surrounded by the I/O region;
a plurality of bonding pads arranged along a peripheral edge of an IC chip;
an upper layer wire mesh formed in the same layer as the plurality of bonding pads and arranged in a region surrounded by the plurality of bonding pads; and
a lower layer wire mesh arranged between the upper layer wire mesh and the semiconductor substrate,
wherein the lower layer wire mesh comprises:
a first lower layer wire mesh formed between the upper layer wire mesh and the core region; and
a second lower layer wire mesh formed between the plurality of bonding pads and the core region.

7. The semiconductor integrated circuit according to claim 6, wherein:
the upper layer wire mesh comprises an upper layer annular power supply wiring;
the second lower layer wire mesh comprises a lower layer annular power supply wiring formed under the plurality of bonding pads; and
the core region comprises a logic cell operating according to electric power supplied through the upper layer annular power supply wiring and the lower layer annular power supply wiring.

8. The semiconductor integrated circuit according to claim 7, wherein:
the plurality of bonding pads comprise:
a power supply pad; and
a signal supply pad for supplying a signal to the plurality of I/O cells; and
the power supply pad is connected to the lower layer annular power supply wiring through a via contact, and to the upper layer annular power supply wiring through a wiring pattern.

9. A semiconductor integrated circuit, comprising:
an I/O region comprising an I/O cell arranged therein;
a core region comprising a logic cell arranged therein; and
an expansion core region formed between the I/O region and the core region, and comprising another logic cell arranged therein, wherein:
the I/O region comprises a first bonding pad formed on the I/O cell, for supplying a signal to the I/O cell;
the core region comprises:
an upper layer wire mesh; and
a lower layer wire mesh formed under the upper layer wire mesh; and the expansion core region comprises:
a second bonding pad formed in the same layer as the upper layer wire mesh;
an expansion lower layer wire mesh located under the second bonding pad, and connected to the lower layer wire mesh in the same layer as the lower layer wire mesh; and
an expansion logic cell arranged in an expansion logic cell region formed under the expansion lower layer wire mesh.

10. The semiconductor integrated circuit according to claim 9, wherein:
the first bonding pad and the second bonding pad comprise:
a signal supply pad for supplying a signal to the I/O cell; and
a power supply pad; and
the power supply pad is connected to an upper layer annular power supply wiring provided in the upper layer wire mesh through a wiring pattern, and to a lower layer annular power supply wiring provided in the lower layer wire mesh formed under the second bonding pad through a via contact.

* * * * *